United States Patent [19]
Guillot

[11] Patent Number: 5,636,423
[45] Date of Patent: Jun. 10, 1997

[54] DEVICE ADAPTED FOR UNCOUPLING TOWER SECTIONS

[76] Inventor: Walter K. Guillot, 4646 Chelsea Dr., Baton Rouge, La. 70809

[21] Appl. No.: 403,233

[22] Filed: Mar. 10, 1995

[51] Int. Cl.⁶ .................................................. B66F 3/00
[52] U.S. Cl. .................. 29/239; 29/267; 254/131
[58] Field of Search .................. 29/238, 239, 267, 29/227; 254/15, 17, 129, 130, 131

[56] References Cited

U.S. PATENT DOCUMENTS

| | | | |
|---|---|---|---|
| 1,041,660 | 10/1912 | Nelson | 29/267 |
| 1,610,988 | 12/1926 | Yawn | 29/267 |
| 2,138,911 | 12/1938 | Evans et al. | 254/130 |
| 2,718,375 | 9/1955 | Purdy | 254/131 |
| 2,823,011 | 2/1958 | Jones | 254/15 |
| 3,612,485 | 10/1971 | McAfee | 254/130 |

*Primary Examiner*—Robert C. Watson

[57] ABSTRACT

A tool is described that reduces very substantially the difficulties previously encountered in dismantling sectioned communications towers. In preferred embodiments the tool also can be used to facilitate erection of such towers. The tool comprises a leverage bar and an articulated arm affixed to depend at an angle from, and to serve as a fulcrum for, the leverage bar. The articulated arm comprises two segments. The first segment is affixed to the leverage bar intermediate the ends thereof and depends therefrom at an angle, preferably about 90°. In addition, the first segment is stationary relative to the leverage bar and is positioned closer to the front end thereof. The second segment is pivotally connected to the first segment close to the free end thereof so that the second segment is rotatable through an arc aligned in substantially the same plane as the plane occupied by the leverage bar.

3 Claims, 3 Drawing Sheets

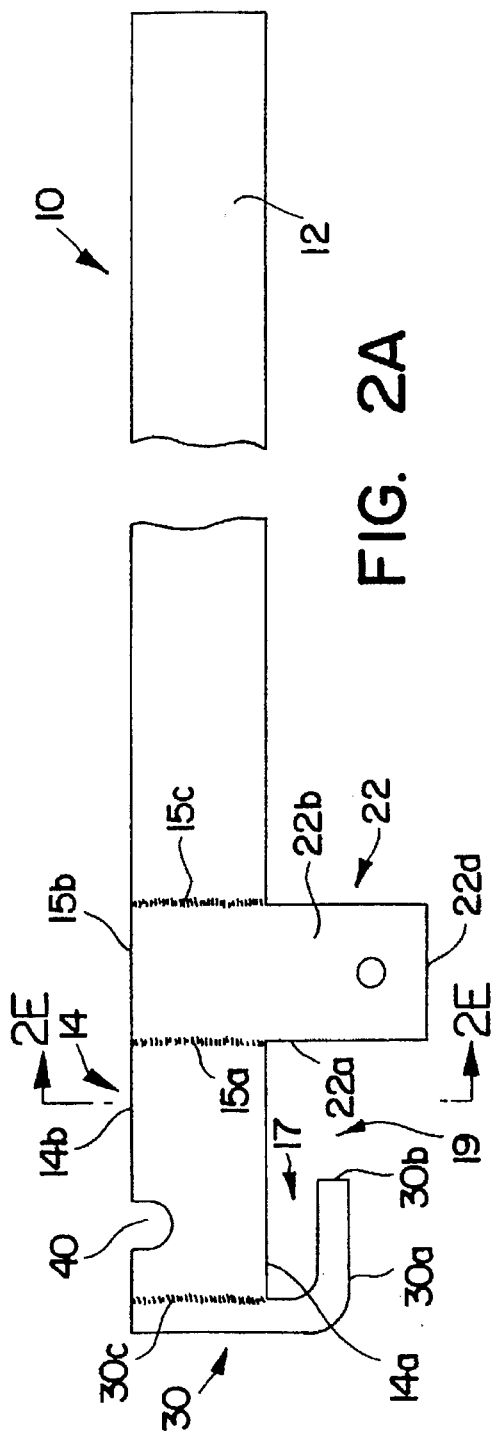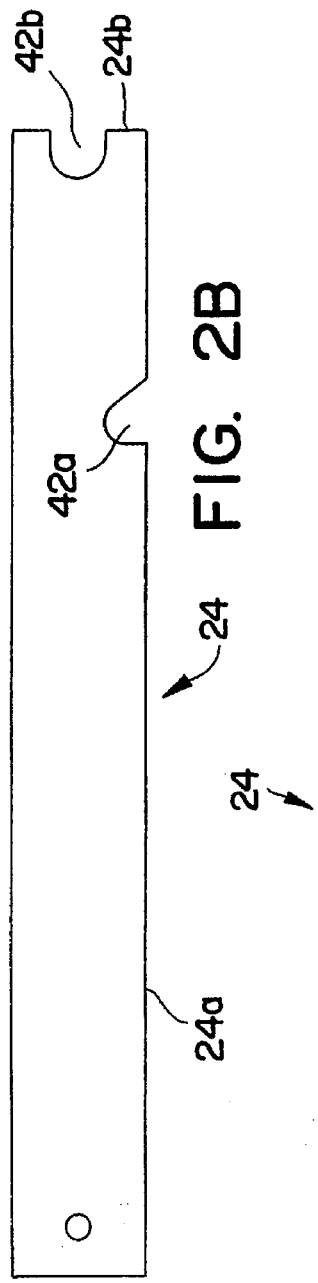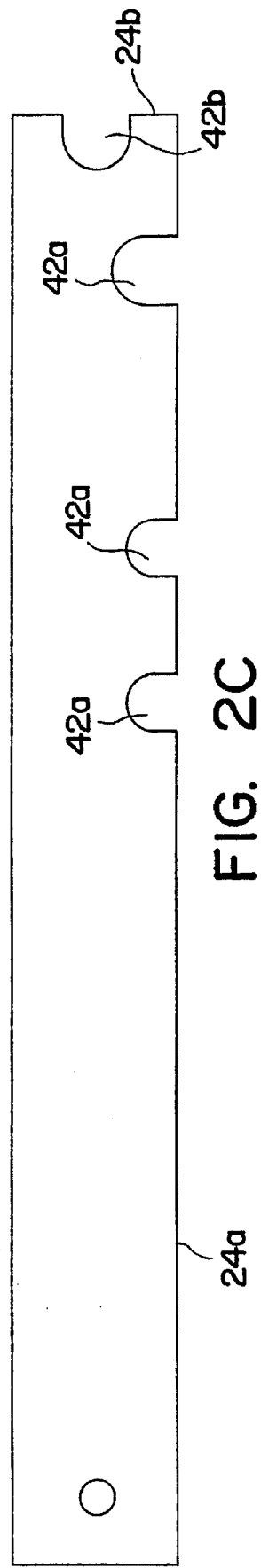

5,636,423

DEVICE ADAPTED FOR UNCOUPLING TOWER SECTIONS

TECHNICAL FIELD

This invention relates to a portable tool construction adapted for use in uncoupling tower sections. In preferred forms the tool can also be used to facilitate the erection of towers composed of tower sections.

BACKGROUND

Towers composed of a plurality of interlocked tower sections are in widespread use for various electronic communication applications. Typically the vertically disposed interconnected sections each comprise a plurality of spaced apart vertical rods arranged for example in an equilateral triangle pattern. The rods in each section are secured together at least in part by horizontal rungs or braces extending between adjacent rods. Additional angularly disposed bracing members are frequently employed in such sections. The sections are successively interconnected at adjacent ends by linear rod end projections of one section received in matching rod receiving end portions in the adjacent section. These interconnections are bolted together through matching apertures in the end projections and in the rod receiving female end portions.

For many years a problem has existed in the dismantling of such towers. Professional tower dismantling specialists and nonprofessional ham operators alike have experienced the difficulties encountered in trying to uncouple unbolted adjacent sections, especially in cases where the tower has been standing for a few years exposed to the elements. Attempts to facilitate this operation have involved use of such things as lengths of two by four lumber and scissor jacks. However, in all cases the work involved—which for the most part must be conducted at elevations above ground—can truly be characterized as "back breaking" work.

It is believed that prior to this invention, no effective, less laborious means existed for facilitating the dismantling of such towers.

THE INVENTION

This invention overcomes the problem referred to above by providing a tool construction which reduces very substantially the difficulties previously encountered in dismantling such towers. Indeed, this invention in preferred embodiments provides a tool construction which also can be used to facilitate the erection of such towers.

In accordance with this invention there is provided a tool which comprises (i) a leverage bar having front and back ends, and (ii) an articulated arm affixed to depend at an angle from the leverage bar and to serve as a fulcrum for the leverage bar. The articulated arm comprises two segments. The first segment is affixed to the leverage bar intermediate the ends thereof and depends therefrom at an angle, preferably about 90°. In addition, the first segment is stationary relative to the leverage bar and is disposed closer to the front end thereof, and thus defines a shorter section of the bar, and a longer section of the bar which serves as the handle of the tool. The second segment is pivotally connected to the first segment close to the end portion thereof that is remote from the leverage bar, so that the second segment is rotatable through an arc aligned in substantially the same plane as the plane occupied by the leverage bar. Although other configurations are feasible, the second segment is preferably disposed so that it can be rotated through an arc of at least 130° and more preferably, an arc of at least 160 degrees.

When used in a tower dismantling operation, the shorter section of the leverage bar is engaged with a lowermost horizontal rung of an upper tower section, and the second segment of the articulated arm is engaged with an uppermost horizontal rung of the next lower tower section. By application of a downward force to the handle, the entire leverage bar is caused to rotate on the axis of the pivotal connection between the first and second segments whereby the shorter section of the bar is caused to apply an upward biasing force to the lowermost rung which in turn uplifts the upper tower section. To facilitate the foregoing engagements the shorter segment and the second segment are both provided with suitably sized and disposed engagement means such as hooks, prongs, or other gripping devices detachably attachable to the rungs and adapted to maintain the engagement with the rungs during the application of the downward force to the handle. Preferably, these engagements are secured by means of suitably sized transverse notches or recesses at least one of which is disposed in the upper part of the shorter segment of the leverage bar and at least one of which is, and preferably two or more of which are, disposed in suitable position(s) of the second segment of the articulated arm. Thus tools of this invention can be provided in which the parts are dimensioned, configured and disposed to accommodate the dimensions of at least one standard sized pair of interconnected tower sections, and preferably the different dimensions of pairs of two or more differently sized standard pairs of interconnected tower sections.

In preferred embodiments, a tool in accordance with the above further comprises a hook enabling the tool to be supported on a tower rung when not in actual use. Preferably the hook is a generally L-shaped hook affixed to and depending from the shorter section of the bar such that the hook is oriented to project in a direction generally toward the first segment and is spaced there-from. Most preferably the hook is also aligned in substantially the same plane as the plane occupied by the leverage bar. This most preferred construction enables the tool to be used both in tower dissembling operations and in tower assembling operations.

These and other aspects and features of the invention will be still further apparent from the ensuing description, accompanying drawings and appended claims.

THE DRAWINGS

In the drawings, wherein like numerals in respective drawings represent like parts:

FIG. 2A depicts in side elevation a leverage bar with an L-shaped hook and a first segment of an articulated arm affixed thereto;

FIG. 2B depicts in side elevation a second segment of an articulated arm;

FIG. 2C depicts in side elevation a more preferred second segment of an articulated arm;

FURTHER DESCRIPTION OF THE INVENTION

Figure 1:
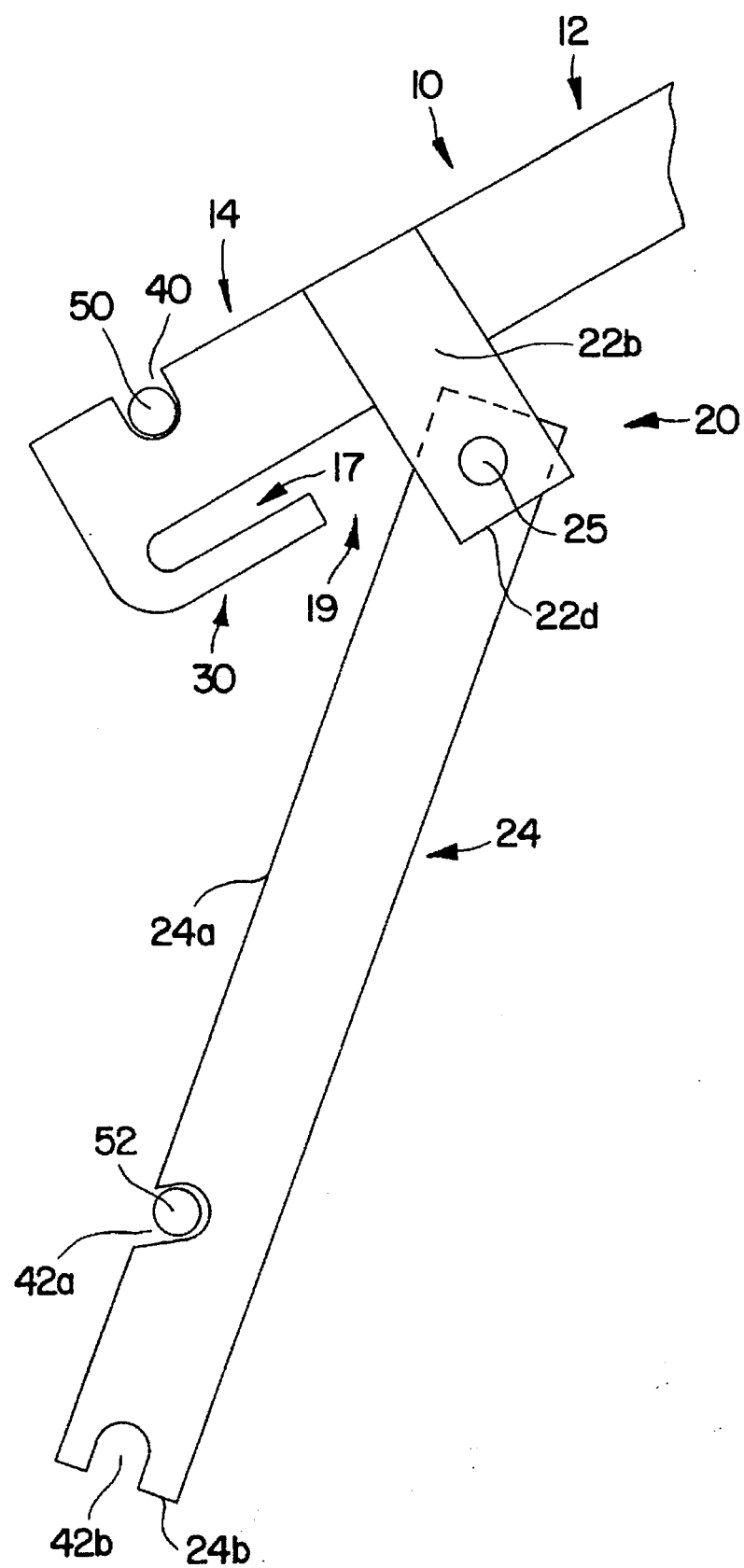
FIG. 1 is a side elevation illustrating a tool of this invention and further illustrating in schematic fashion the manner by which the tool can be used in a tower dismantling operation.

Referring to the Figures, the tools of this invention comprise leverage bar 10 having articulated arm 20 composed of first segment 22 depending at an angle from bar 10, and second segment 24 connected to segment 22 by pivot pin 25. Bar 10 is composed of an elongate or long section 12 serving as the handle, and a shorter section 14 which delivers the upward biasing force in a dismantling operation. Arm 20 serves as a fulcrum for the leverage bar. In order to provide a desirable amount of upward biasing force, section 12 is preferably at least about 4 times as long as section 14, more preferably at least about 6 times as long as section 14, and most preferably at least about 7 times as long as section 14.

Figure 2D:
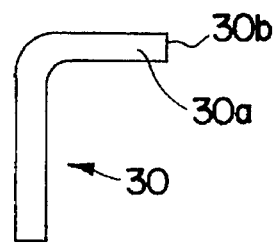
FIG. 2D depicts in enlarged side elevation an L-shaped hook.
Figure 2E:
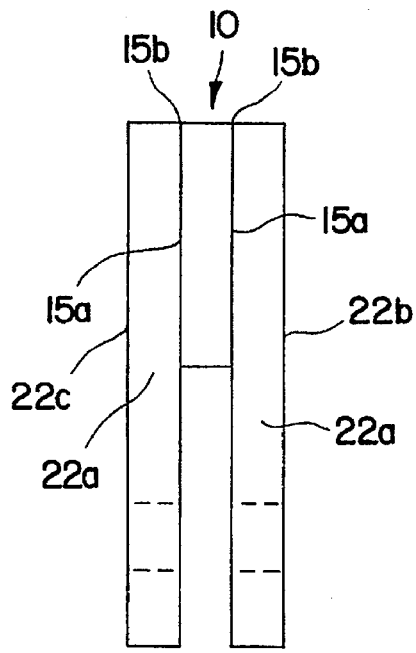
FIG. 2E is a section taken along line A—A of FIG. 2A.

In preferred embodiments, the tool additionally comprises a hook 30, most preferably an L-shaped hook configured as depicted in FIGS. 2A and 2E and oriented as depicted in FIG. 2A. A function of the hook is to provide a way of hanging the tool on the rungs of the tower so that the user's hands can be freed of the tool when it is not in use while at the same time keeping the tool close at hand for use. To serve this single function, hook 30 can be of any suitable configuration and can be disposed on the tool at any suitable location as long as the hook is large enough to enable the tool to be hung on a suitable part of the tower such as a horizontal rung thereof.

Figure 3:
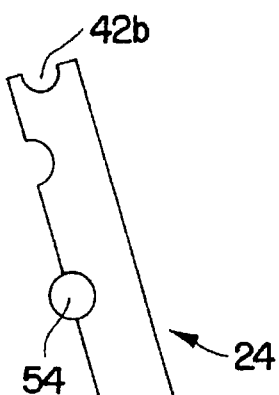
FIG. 3 is a side elevation illustrating a tool of this invention and further illustrating in schematic fashion the manner by which the tool can be used in a tower assembling operation.
Figure 3:
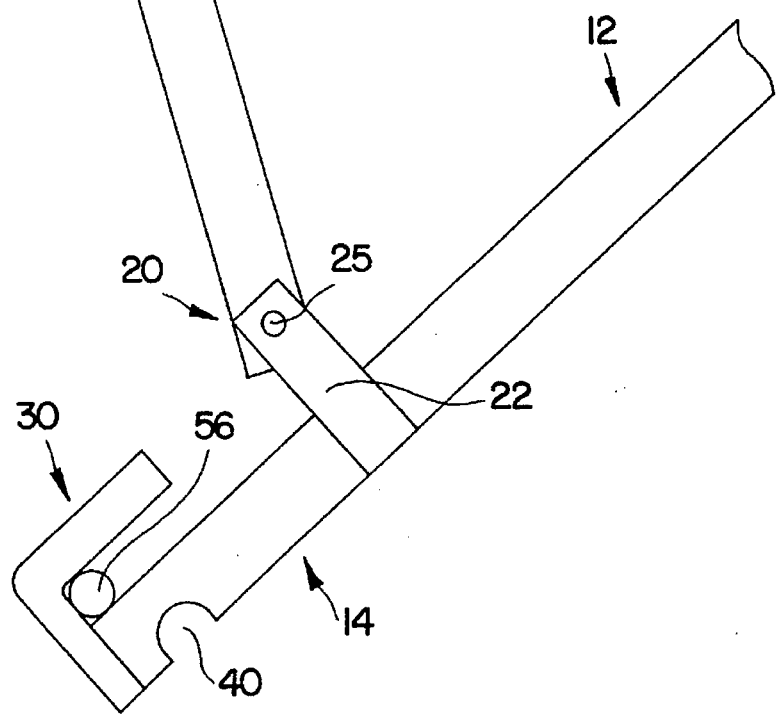

In the more preferred form as depicted in FIG. 2A hook 30 is affixed to and depends from shorter section 14 of bar 10 such that the hook is oriented to project in a direction generally toward segment 22 and is spaced therefrom. The space 17 between the projecting portion or leg 30a of hook 30 and the proximate edge 14a of section 14 is sized to accommodate the horizontal rungs of the tower, most preferably as a loose slip fit. Likewise the space 19 between the free end 30b of leg 30a and the proximate edge 22a of segment 22 should be at least large enough to provide access of the hook to the horizontal rung so that the tool can be readily hung on and removed from a horizontal tower rung. Most preferably, hook 30, configured and oriented as just described, is aligned in substantially the same plane as the plane occupied by leverage bar 10. This enables the tool to be used both in disassembly of sectioned towers as illustrated in FIG. 1 and to facilitate assembly of sectioned towers as depicted and illustrated in FIG. 3. Thus hook 30 in this most preferred form has dual functions: (1) it enables the tool to be hung on the tower to free the user's hands, and, (2) the tool can be used to facilitate erection of towers when used as illustrated in FIG. 3 and described hereinafter.

In addition, the configuration of the hook as depicted in FIGS. 2A and 2E is advantageous because such L-shaped hooks can be easily fabricated from readily available materials at low cost.

While various materials of construction can be used for fabricating the tools, use of 0.25 inch×1.25 inch iron bar stock of suitable lengths has been found highly suitable for making leverage bar 10, first segment 22, and second segment 24. For fabricating hook 30 in L-shaped form such as depicted in FIG. 2E, iron rod of suitable diameter such as 0.3125 inch is highly suitable.

Segment 22 is stationary relative to leverage bar 10, and in the form depicted (note especially FIG. 2E) is composed of two short lengths of bar stock 22b, 22c affixed to and aligned in parallel on the opposite sides of bar 10. As seen from FIG. 2A, the short lengths are secured to bar 10 by welds 15a, 15b, 15c at the external seams therebetween.

Segment 24, the second segment, is pivotally connected to the first segment close to the free end portion 22d thereof that is more remote from bar 10, so that segment 24 is rotatable through an arc aligned in substantially the same plane as the plane occupied by the leverage bar. Although other configurations are feasible, the second segment is preferably disposed so that it can be rotated through an arc of at least 130° and more preferably, of at least 160 degrees.

As seen from FIGS. 2A and 2E, the preferred form of hook 30 is affixed to the front end of section 14 by a weld 30c at the seam therebetween.

In the forms depicted, the tool has at least one transverse notch 40 in the upper edge 14b of section 14, and two or more transverse notches 42 in segment 24, two or more disposed in front edge 24a and one disposed at free end 24b of segment 24. Notches 40 and 42 are sized and disposed to accommodate the horizontal rungs of the tower such as is illustrated in FIG. 1. As noted above, other types of suitable rung-gripping means can be used if desired.

FIG. 1 makes clear how the tool is used in a tower disassembly operation. In FIG. 1 rung 50 the lowermost horizontal rung of an upper tower section to be loosened and removed and rung 52 is the uppermost horizontal rung of the next lower tower section. After any bolts uniting the male-female connections between such upper and next lower tower sections have been removed, the tool is placed with notch 42a in registration with rung 52, and with notch 40 in registration with rung 50. If the tower sections are of a larger size, notch 42b instead of notch 42a would be placed in registration with rung 52. In any event, application of downward manual force to handle 12 causes the tool to rotate on the axis of pivot pin 25 and apply an upward biasing force against rung 50 via section 14 thereby loosening the interconnection between these two tower segments and enabling the upper tower section to be lifted off the tower. Because of the gain in biasing force due to the leverage effect, the interconnection between the two adjacent tower sections is greatly facilitated even where the male-female connections may have become rusted or tightly wedged together due to the mass of the tower structure. This process is then repeated as many times as necessary in order to loosen and remove each successive tower section.

As indicated in FIG. 3, assembly of a tower from tower sections can be facilitated by use of a preferred tool of this invention. In FIG. 3 rung 54 the lowermost horizontal rung of an upper tower section to be tightened down onto the next lower tower section, and rung 56 is the uppermost horizontal rung of that next lower tower section. As FIG. 3 indicates, the tool is used in inverted position in order to apply a downward biasing force to rung 54 to ensure a secure fit at the male-female connections between these two tower sections. Thus the tool is placed with an appropriate notch 42 in registration with rung 54, and with hook 30 in registration with rung 56. Application of downward manual force to handle 12 causes the tool to apply a downward biasing force to rung 54 via segment 24 thereby tightening the interconnection between these two tower segments. Thereupon the interconnection can be further secured by bolting the connections together.

Typical commercially available tower sections of the type referred to above include the ROHN 20, 25, 45 and 55 Communications Structures, available from ROHN, 6718 West Plank Road, P.O. Box 2000, Peoria, Ill. 61656. Tower units and various details concerning the erection of towers therewith are set forth in the ROHN Consumer Products Catalog relating to antenna mounting products and accessories, copyright 1992 by ROHN. This invention is not limited, however, to the tower constructions of any single manufacturer, as the principles of this invention are applicable to any tower structures of the same general type.

It will be readily apparent that this invention is susceptible to considerable variation and modification in its practice. Therefore, this invention is not intended to be limited by the specific exemplifications presented hereinabove. Rather, what is intended to be covered is within the spirit and scope of the appended claims and the range of equivalents thereto available as a matter of law.

I claim:

1. A tool which comprises:

(i) a leverage bar having front and back ends, (ii) an articulated arm affixed to depend at an angle from the leverage bar and to serve as a fulcrum for said leverage bar, wherein said arm comprises:

a) a first segment affixed to said bar intermediate the ends thereof and depending therefrom at an angle of about 90 degrees, said first segment being stationary relative to said bar and disposed closer to the front end thereof thereby defining in the said bar a shorter section and a longer section to serve as the handle of the tool, and having an end portion spaced from said bar, and b) a second segment pivotally connected to said first segment in the end portion thereof so that the second segment is rotatable through an arc aligned in substantially the same plane as the plane occupied by the leverage bar, and (iii) a generally L-shaped hook affixed to and depending from said shorter section of the bar such that the hook is oriented to project in a direction generally toward said first segment and is spaced therefrom;

wherein said hook is aligned in substantially the same plane as the plane occupied by the leverage bar; the arch through which said second segment can be rotated is an arc of at least 130 degrees; and said shorter section of the bar has at least one transverse notch disposed and adapted to engage a horizontal rod and apply thereto a force opposed to said biasing force.

2. A tool in accordance with claim 1 wherein said arc is an arc of at least 160 degrees.

3. A tool in accordance with claim 2 wherein said second segment has two or more of said transverse notches.

* * * * *